(12) United States Patent
Roest et al.

(10) Patent No.: US 8,531,862 B2
(45) Date of Patent: Sep. 10, 2013

(54) GENERATING AND EXPLOITING AN ASYMMETRIC CAPACITANCE HYSTERESIS OF FERROELECTRIC MIM CAPACITORS

(75) Inventors: Aarnoud Laurens Roest, Geldrop (NL); Mareike Klee, Straelen (DE); Rudiger Mauczok, Erkelenz (DE); Klaus Reimann, Eindhoven (NL); Michael Joehren, Pinneberg (DE)

(73) Assignee: NXP B.V., Eindhoven (NL)

( * ) Notice: Subject to any disclaimer, the term of this patent is extended or adjusted under 35 U.S.C. 154(b) by 302 days.

(21) Appl. No.: 13/125,822

(22) PCT Filed: Oct. 24, 2009

(86) PCT No.: PCT/IB2009/054704
§ 371 (c)(1),
(2), (4) Date: Apr. 28, 2011

(87) PCT Pub. No.: WO2010/049864
PCT Pub. Date: May 6, 2010

(65) Prior Publication Data
US 2011/0198725 A1    Aug. 18, 2011

(30) Foreign Application Priority Data
Oct. 27, 2008 (EP) .................... 08167646

(51) Int. Cl.
*G11C 11/22* (2006.01)
*H02H 3/22* (2006.01)
*H03B 5/20* (2006.01)

(52) U.S. Cl.
USPC ........... 365/145; 365/149; 361/88; 331/177 V

(58) Field of Classification Search
USPC ................ 365/145, 149; 361/88; 331/177 V
See application file for complete search history.

(56) References Cited

U.S. PATENT DOCUMENTS

| 5,216,572 A | 6/1993 | Larson et al. |
| 5,262,983 A | 11/1993 | Brennan |
| 5,524,092 A | 6/1996 | Park |

(Continued)

FOREIGN PATENT DOCUMENTS

KR    100 327 483 B1    2/2002

OTHER PUBLICATIONS

Skriver et al., "Surface energy and work function of elemental metals", Sep. 1992, Physical Review B, vol. 46, No. 11, pp. 7157-7168.*

(Continued)

*Primary Examiner* — Evan Pert

(57) ABSTRACT

The present invention relates to an electric component comprising at least one first MIM capacitor having a ferroelectric insulator with a dielectric constant of at least 100 between a first capacitor electrode of a first electrode material and a second capacitor electrode of a second electrode material. The first and second electrode materials are selected such that the first MIM capacitor exhibits, as a function of a DC voltage applicable between the first and second electrodes, an asymmetric capacitance hysteresis that lets the first MIM capacitor, in absence of the DC voltage, assume one of at least two possible distinct capacitance values, in dependence on a polarity of a switching voltage last applied to the capacitor, the switching voltage having an amount larger than a threshold-voltage amount. The invention is applicable for ESD sensors, memories and high-frequency devices.

12 Claims, 9 Drawing Sheets

(56) References Cited

U.S. PATENT DOCUMENTS

| | | | |
|---|---|---|---|
| 6,433,377 B1 | 8/2002 | Ohno | |
| 7,449,346 B2 * | 11/2008 | Buehlmann | 438/3 |
| 2002/0177326 A1 | 11/2002 | Klee et al. | |
| 2003/0034520 A1 | 2/2003 | Kusunoki | |
| 2004/0235285 A1 | 11/2004 | Kang et al. | |
| 2007/0059929 A1 | 3/2007 | Cho et al. | |

OTHER PUBLICATIONS

English Translation of KR 100327483 (Yu). Schreiber Translations, Inc., Apr. 2013, 21 pages.*

Moazzami et al., "Electrical Characteristics of ferooelectric PZT thin films for DRAM applications", Sep. 1992, IEEE Transactions on Electron Devices, vol. 39, No. 9, pp. 2044-2049.*

Cagin, E., et al.; "Hysteretic Metal-Ferroelectric-Semiconductor Capacitors Based on PZT/ZnO Heterostructures"; J. of Physics D. Applied Physics, IOP Publishing, Bristol, GB, vol. 40, No. 8; pp. 2430-2434 (Apr. 4, 2007).

International Search Report and Written Opinion for Application PCT/IB2009/054704 (May 26, 2010).

* cited by examiner

US 8,531,862 B2

GENERATING AND EXPLOITING AN ASYMMETRIC CAPACITANCE HYSTERESIS OF FERROELECTRIC MIM CAPACITORS

FIELD OF THE INVENTION

The present invention relates to an electric component comprising a ferroelectric MIM capacitor. A ferroelectric MIM capacitor is a capacitor of the metal-insulator-metal type with a ferroelectric insulator. The invention also relates to a method for detecting electrostatic discharge (ESD) events and to a corresponding a ESD sensor device comprising the subject electric component. Furthermore, the invention relates to a ferroelectric memory, which comprises the subject electric component, and to a method for reading from the ferroelectric memory. The subject matter disclosed in the document US 2002/0177326 A1 is incorporated herein in its entirety.

BACKGROUND OF THE INVENTION

U.S. Pat. No. 5,524,092 describes a multilayered ferroelectric-semiconductor memory device, in which two different values of the capacitance of the device are available, depending on the direction of the polarization of the ferroelectric layer. To this end, a ferroelectric-semiconductor interface is provided. Determining the capacitance of the structure allows to derive the polarization state of the ferroelectric layer without changing it. This way, information can be stored and nondestructively read. However, the layer structure of U.S. Pat. No. 5,524,092 is rather complicated. Furthermore, it has been proven technologically difficult to fabricate layer structures with a semiconductor material such as silicon adjacent to a ferroelectric. This reduces the choice of materials and requires the use of materials, which are not typically integrated into an industrial fabrication process. This in turn increases the processing cost.

U.S. Pat. No. 5,262,983 discloses a memory comprising a ferroelectric capacitor. Application of an external voltage generates respective space charge regions proximate to a respective interface between the ferroelectric and each electrode. Sandwiched between the space charge regions, an uncharged region of the ferroelectric remains. The ratio of the extensions of the uncharged regions of the ferroelectric material and of the space charge regions in the direction of the layer sequence influences the capacitance. A hysteresis of the capacitance vs. voltage is effected by a superposition of the internal polarization of the ferroelectric and of the polarization of the space charge regions under application of an external electric field. A number of distinguishable, stable states for storing values can be provided this way.

A write signal has a bias voltage greater than the coercive voltage of the ferroelectric layer. Two situations can be distinguished:
a) The bias voltage establishes an electric field that is additive with the internal polarization field. This increases the size of the space charge region, with a concomitant decrease in capacitance.
b) The bias voltage establishes an electric field that is subtractive to the internal polarization field. This decreases the size of the space charge region, with a concomitant increase in capacitance.

The actual capacitance value assumed by the capacitor depends on the history of the bias voltage. A larger capacitance is achieved after scanning the bias voltage to a negative voltage larger than the coercive field. A smaller capacitance is achieved by scanning the bias voltage to a positive value larger than the coercive field of opposite polarity.

There are several issues that render the device described in U.S. Pat. No. 5,262,983 undesirable for application in the field.

First, if the space charges are immobile at high frequency, then the full layer stack will always have the same capacitance. Accordingly, the space charge regions have to be electrically conductive at the desired frequency of operation. They in effect behave as semiconductor regions. It is known that ferroelectric materials can be made semiconductive. Semiconductor materials allow the formation of a depletion layer, which can act as a capacitance sensor. In other words, in the device of U.S. Pat. No. 5,262,983, the capacitance is not defined by the neutral zone in the ferroelectric layer, but by the extension of the depletion layer in the space-charge region. As a result, the layer structure of this document resembles that of U.S. Pat. No. 5,524,092 and shares its disadvantage of high complexity.

Second, in the device of U.S. Pat. No. 5,262,983, a non-zero bias voltage has to be applied in a read operation to differentiate between capacitance states.

It would be desirable to provide a capacitive structure for an electric component that does not require the application of a bias voltage for determining the capacitance state.

SUMMARY OF THE INVENTION

According to a first aspect of the invention, an electric component is provided that comprises:
  at least one first MIM capacitor having a layer structure including a ferroelectric insulator with a dielectric constant of at least 100 between a first capacitor electrode of a first electrode material and a second capacitor electrode of a second electrode material; wherein
  the first and second electrode materials are selected such that the first MIM capacitor exhibits, as a function of a DC voltage applicable between the first and second electrodes, an asymmetric capacitance hysteresis that lets the first MIM capacitor, in absence of the DC voltage, assume one of at least two possible distinct capacitance values, in dependence on a polarity of a switching voltage last applied to the capacitor, the switching voltage having an amount larger than a threshold-voltage amount; and
  a circuit, which is operably connectable to the MIM capacitor and which is configured to generate and provide an output signal, which depends on the capacitance value of the at least one first MIM capacitor assumed in absence of the DC voltage on the first MIM capacitor or at an amount of the DC voltage on the first MIM capacitor, which is smaller than a quarter of a voltage difference between a positive and a negative coercive voltage associated with the ferroelectric insulator layer of the first MIM capacitor.

The electric component of the invention achieves a particularly strong hysteresis asymmetry of the capacitance of the first MIM capacitor as a function of an applied DC bias voltage, meaning that the maximum of the capacitance-voltage curve occurs at different DC bias voltages depending on the bias history. This gives rise to a particularly strong capacitance contrast at and near a DC bias voltage of 0 V for the different bias histories. This in turn leads to the possibility of reading out a bias history of the ferroelectric MIM capacitor even without having to apply a bias voltage. A wide range of applications for the electric component is opened up, which will be described by way of embodiments hereinafter.

The electric component of the present invention has the further advantage that a particularly long lifetime of the MIM capacitor and thus of the electric component is achieved by generating and providing an output signal, which depends on the capacitance value of the at least one first MIM capacitor either assumed in absence of the DC voltage on the first MIM capacitor or at the very small DC voltage (i.e., in the above-mentioned meaning).

A DC voltage in the present context of a capacitance measurement is considered a voltage, which is constant throughout the capacitance measurement or, if changing in time at all, which has a rate of relative voltage change over the duration of the capacitance measurement, which is smaller than the reciprocal value of the duration of the capacitance measurement. The term "relative" refers to the maximum bias voltage applicable to the MIM capacitor as a reference.

The coercive voltage is a respective positive or negative voltage value, which is a characteristic of a given ferroelectric insulator layer in the first MIM capacitor. It is a technical parameter well known in the art.

The wording "in absence of a DC voltage" refers to a DC bias voltage of 0 V. A DC bias voltage smaller than a quarter of a voltage difference between a positive and a negative coercive voltage associated with ferroelectric insulator layer of the MIM capacitor will herein also be referred to as a "very small DC voltage" or a "very small DC bias voltage" or a "very small bias voltage".

Furthermore, the electric component is suitable for applications even without external power supply.

In the following, embodiments of the electric component will be described by way of their features, which are provided in addition to those of the electric component of the present invention. Additional embodiments can be derived by combining the additional features of different embodiments with each other, unless such a combination is excluded explicitly or implicitly, namely by facts known to the person of ordinary skill in the art, that the additional features can only be realized as alternatives to each other.

The term "ferroelectric insulator" is to be understood as comprising in different embodiments a ferroelectric or an anti-ferroelectric material. In the art, the term ferroic is sometimes used as a generic term that encompasses both alternatives for spontaneous polarization, including a coupling to magnetic polarization.

The at least two capacitance values of the at least one first MIM capacitor that can be assumed in the absence of the DC voltage between the capacitor electrodes are distinct in the sense that they differ from each other by an amount that allows distinguishing between the assumed capacitance values in the output signal of the circuit, which output signal depends on the capacitance value assumed in absence of the DC voltage. In one embodiment, the capacitance values, in absence of the applied DC voltage, i.e., at zero voltage, differ by at least 5% from each other. That means, the lowest of the two or more possible capacitance values is at most 95% of the highest value. In another embodiment, they differ by at least 10% from each other. In a further embodiment, the difference between the lowest and he highest capacitance value is about 20% of the highest capacitance value.

The threshold-voltage amount required for changing the capacitance value, which is assumed in absence of the DC voltage, correlates with the coercive field that must applied to the ferroelectric insulator of the first MIM capacitor in a particular capacitor structure. Typical values for the threshold-voltage amount range between 1 and 20 V. However, this is not to be understood as a restriction. The first MIM capacitor may be designed to exhibit another desired threshold-voltage amount.

Typically, as is well known from the physics of ferroelectric materials, the switching voltage must also have a specific polarity, depending on the capacitance value currently assumed by the first MIM capacitor. If an unsuitable switching-voltage polarity is used, the capacitance value, as measured in the absence of the DC voltage or at the very small DC voltage, will not change.

One way to achieve a hysteresis with the characteristics of the MIM capacitor of the electric component of the present invention is to provide a first and a second capacitor electrode, the first and second electrode materials of which are metals and differ from each other at least by having different work functions. As is well known, the work function of a metal is the energy needed to move an electron from the Fermi energy level of the metal into a vacuum. This parameter that characterizes a given metal, is well known in the art for many metals.

In one particular form of this embodiment, the first capacitor electrode is made of Ti/Pt and the second capacitor electrode is made of TiW. TiW has a lower work function than Ti/Pt, and it is preferably used as a material for a top electrode as opposed to a bottom electrode disposed on a substrate.

However, this embodiment forms only a non-restrictive example. Other metals can be used. It should be noted that it is possible to even use the same metal and apply different fabrication conditions or different treatment to the electrodes in order to achieve different work functions in the respective electrode materials. This simplifies the fabrication of the first MIM capacitor in the context of the fabrication of the electric component.

For some applications, consideration should be given to the fact that many ferroelectric materials gradually change their hysteresis characteristics during the lifetime of the electric component. To avoid false interpretation of the output signal of the circuit, one embodiment of the electric component further comprises:
- a second MIM capacitor having a capacitance-voltage hysteresis of the same kind as the first MIM capacitor. In the electric component,
- the first electrode of the first MIM capacitor and the second electrode of the second MIM capacitor are both connected to a reference potential;
- the switching voltage is applicable in parallel to the second electrode of the first MIM capacitor and to the first electrode of the second MIM capacitor; and
- the capacitance-sensor unit is configured to generate first and second capacitance sensor signals indicative of the capacitance values in the absence of the DC voltage, of the first and of the second MIM capacitors, respectively.

The referenced potential is in one embodiment a ground potential or mass.

The provision of two MIM capacitors with the described opposite connections allows applying the switching voltage between the second electrode of the first MIM capacitor and the first electrode of the second MIM capacitor. Since the capacitance of the MIM capacitor will only change if the applied switching voltage has a negative polarity, the two capacitors are put in an anti-parallel configuration. In this configuration, one of the two capacitors will always experience the applied switching voltage as negative and therefore change its capacitance value. In this way, it is possible to simultaneously register the sign and the energy of an applied switching signal. It is also possible to reset both capacitors after the application of a switching voltage in order to be able to register a next switching event.

Suitably, the circuit of the electric component forms a part of, or, in the alternative, fully forms a capacitance-sensor unit, which is configured to generate and provide at its output a capacitance-sensor signal. The capacitance-sensor signal is indicative of the momentaneous or current capacitance value in the absence of DC voltage of the at least one first MIM capacitor. With a capacitance-sensor unit, the electric component is suited for a wealth of applications that employ a switching of the capacitance value in the absence of the DC voltage in sensor device.

More specifically, as an example of a circuit that only is a part of a capacitance-sensor unit, the circuit may be configured to measure and provide at its output a momentaneous value of an electrical quantity of the first circuit that depends on the capacitance of the MIM capacitor. The capacitance-sensor unit in turn may be configured to derive from the measured momentaneous value of the electrical quantity a capacitance-sensor signal indicative of the momentaneous capacitance value of the MIM capacitor. This capacitance-sensor signal is provided as an output of the capacitance-sensor unit.

The electric component of this embodiment is useful in many applications, including memory applications and ESD sensor applications. This will be elucidated in the course of the description of further embodiments.

For some applications, a single first capacitor is enough. However, since a capacitance switching is achieved with a switching voltage of a predetermined switching-voltage polarity, a detection of an occurrence of a desired or of an undesired and unexpectedly high voltage of the polarity opposite to the switching-voltage polarity would not be possible if only a single first MIM capacitor is used.

If occurrence of a high voltage (i.e., larger than the switching voltage,) is to be detected with sensitivity also to the voltage polarity, a further embodiment of the electric component, which comprises a second MIM capacitor, is useful. The first and second MIM capacitors are connected to each other in an antiparallel configuration. By detecting the capacitances of the first and second MIM capacitors in their anti-parallel configuration, both voltage polarities can be detected. For a capacitance change is only observed if a switching voltage polarity (typically a negative voltage polarity) is applied. By providing two MIM capacitors in an antiparallel configuration, one of the two will always experience an applied voltage as negative, thus allowing to simultaneously register sign and energy of the (ESD) voltage.

In this anti-parallel configuration, the first electrode of the first MIM capacitor and the second electrode of the second MIM capacitor are suitably connected to ground. The switching (or ESD) voltage is applicable between the second electrode of the first MIM capacitor and the first electrode of the second MIM capacitor. The second MIM capacitor is suitably of the same type as the first MIM capacitor.

The capacitance-sensor unit of this type of embodiment of the electric component is configured to individually measure the capacitance of the first and second MIM capacitors and to derive first and second capacitance sensor signals indicative of the capacitance of the first and of the second MIM capacitor, respectively.

Preferably, the capacitance-sensor unit is additionally configured to derive and provide a polarity-sensor signal indicative of the polarity of the switching voltage, from the measured capacitances. The polarity information can for instance be determined from a comparison of the capacitance values of the first and second MIM capacitors. Thus, the capacitance-sensor unit is suitably configured to compare the capacitance values for the first and second MIM capacitors and to provide a polarity information indicative of the a polarity of the switching voltage last applied to the MIM capacitor, in dependence on the result of the comparison. Of course, the provided polarity information can be integrated into one of the capacitance sensor signals.

The measured capacitances of the first and, if of the same type according to the present invention, also the second MIM capacitor are indicative of the bias histories of the capacitors in the sense that an energy of a bias voltage last applied can be detected. For ESD sensor applications, a detection of an energy amount delivered by an ESD pulse may be useful to assess a probability of damage to an electronic circuit. To this end, one embodiment comprises an ESD evaluation unit. The ESD evaluation unit is connected with the capacitance-sensor unit of the electric component and configured to derive from the capacitance-sensor signals information on an energy amount and polarity provided to the ESD sensor by the electrostatic discharge event.

It is possible to reset the ESD sensor after an ESD event to be able to register the next ESD event based on the same voltage-dependent capacitance behavior. To this end, an embodiment of the ESD sensor comprises a reset unit, which is connected with the capacitance sensor unit. The reset unit is configured to provide, after a detection of the capacitance of the first MIM capacitor or the second MIM capacitor having assumed the respective lower capacitance value, a reset voltage of a reset-voltage amount and a reset voltage polarity to the first and/or second capacitor, respectively, such that the first and second MIM capacitors both re-assume their respective higher capacitance value.

In other applications, it may be desired to provide an electric component, which is able to provide different capacitance values, and to allow a switching between these capacitance values. Accordingly, one embodiment of the electric component comprises:
- a switching unit, which is either connected or connectable with the at least one first MIM capacitor and which is configured to provide one of two alternative switching voltages of suitable polarity and of a suitable amount for switching the capacitance of the at least one first MIM capacitor between a lower and a higher capacitance value, depending on the momentaneous capacitance value assumed by the first MIM capacitor. This way, a reversible switching between the lower and the higher capacitance values is achievable. The switching-voltage amount should be selected to exceed the coercive field.

This embodiment, if combined with the previously described embodiment, which additionally comprises a capacitance-sensor unit, allows building a ferroelectric memory. An advantage of this ferroelectric memory structure is that it allows a non-destructive readout. Furthermore, the memory is non-volatile.

A ferroelectric memory based on the present invention further comprises in one embodiment
- a plurality of first MIM capacitors, each associated with an address and each being configured to store at least one respective bit of information in the form of a respective capacitance value assumed in absence of a DC voltage applied between the capacitor electrodes,
- a read unit, which comprises the capacitance-sensor unit and has an input for receiving address information indicative of at least one of the first MIM capacitors to be read; and
- a write unit, which comprises the switching unit, and which has an input for receiving write information to be written to the memory, and address information indicative of at least one of the first MIM capacitors to be written to.

The read unit will in operation generate and provide at its output a capacitance-sensor signal for each of the MIM capacitors indicated by the address information. The output of the read unit is an information signal having information bits corresponding to the respective momentaneous capacitance values assumed in absence of a DC voltage. The write unit, in operation, provides a switching signal if a state of a memory cell is to be changed according to received write information and received address information. Further embodiments of a ferroelectric memory will be presented further below in the context of the description of the enclosed drawings.

A further application case of the electric component of the first aspect of the invention is a radio-frequency (RF) component. Two preferred application case of the RF component are described in the following:

a) In a first preferred application case of the RF component, the circuit of the electric component of the first aspect of the present invention is configured to generate an output signal with a frequency that depends on the capacitance of the MIM capacitor in the absence of the DC voltage.

The RF component of this type allows tuning the frequency. This ability is advantages in many application contexts. Exemplary RF components of this type form or comprise oscillators, like for instance voltage-controlled oscillators (VCOs). Mobile telephones for instance have to provide capability for operation at more and more different frequencies. Using the RF component of the present embodiment, a reconfigurability is achieved, which allows omitting dedicated receiving and transmitting circuitry for all different frequencies of operation. Instead, a single receiving and transmitting circuitry can be used and tuned to a desired frequency.

b) In a second application case of the RF component, additionally or alternatively to the first application case, a response of the RF component to RF signals depends on the capacitance of the MIM capacitor in the absence of the DC voltage on the first MIM capacitor or at an amount of the DC voltage on the first MIM capacitor, which is smaller than a quarter of a voltage difference between a positive and a negative coercive voltage associated with the ferroelectric insulator layer of the first MIM capacitor. The response of the RF component can also be described as an output signal detectable at an output of the RF component. Exemplary RF components of this type form comprise filters or matching networks.

As has become clear from the previous description, the electric component of the present invention can be used in many application contexts. Correspondingly, different electronic components form embodiments of the present invention. The invention can thus be used to provide a technology platform for a large number of different electronic components containing integrated asymmetric ferroelectric MIM capacitors.

An electronic components according to a preferred embodiment advantageously comprises a semiconductor substrate with an integrated circuit having at least one electric component according to the first aspect of the invention or one of its embodiments disclosed, and one or more of the following components integrated in or on the substrate:
 a resistor;
 a ferroelectric capacitor;
 an ESD protection diode; or
 an active integrated circuit.

The ferroelectric capacitor of the electronic component has in one embodiment a different structure than the first MIM capacitor of the electric component of the first aspect of the invention. In particular, such embodiments have ferroelectric MIM capacitors with a symmetric instead of an asymmetric capacitance hysteresis, implying particularly that at zero bias voltage there is only one capacitance value assumed irrespective of the voltage history the capacitor has experienced.

A preferred embodiment of the electronic component has the previously described ESD-sensor embodiment of the electric component (also defined in claim 6) integrated on the substrate. A further embodiment has an integrated memory forming the active integrated circuit. The memory can for instance take the form of the above-described ferroelectric-memory embodiment of the electric component (also defined in claim 11). The resistor can be formed as an integrated thin film resistor containing an alloy of one or more elements of Mo, Ni, Cr, Ti, Si or W or from a semiconducting material such as Si. Such resistors can be arranged on top of integrated ferroelectric MIM capacitors on the same substrate to save chip area. In particular, such thin-film resistors can at the same time form an electrical interface to the ferroelectric capacitor.

A further embodiment has the electric component in the form of an RF component as described in the previous description (also defined in claim 12) integrated on the substrate. It is understood that the electronic component may comprise a plurality of each of the components mentioned, or a combination of at least two different embodiments of the electric component of the first aspect of the invention.

The electronic component of the present invention provides an integration of the electric component with the integrated circuit on a single substrate. Of course, a combination of such a substrate with other substrates, for instance in a System-in-package, is possible, to form more complex IC packages.

A further aspect of the present invention is formed by a method for detecting an occurrence of an ESD event in an electronic component. The method comprises:
 providing the electronic component with an ESD sensor according one of the ESD-sensor embodiments described herein; and
 ascertaining the capacitance of the at least one first MIM capacitor, in the absence of a DC voltage applied to the electrodes of the at least one first MIM capacitor.

A further aspect of the invention is formed by a method for reading from a ferroelectric memory. The method comprises:
 providing a ferroelectric memory according one of the ferroelectric-memory embodiments described herein;
 receiving address information of at least one memory cell to be read from;
 ascertaining the capacitance of the at least one first MIM capacitor of the at least one memory cell indicated by the address information, in the absence of a DC voltage applied to the electrodes of the at least one first MIM capacitor.

Preferred embodiments of the invention are defined in the dependent claims.

DETAILED DESCRIPTION OF THE INVENTION

The present invention is further elucidated by the following Figures and examples, which are not intended to limit the scope of the invention. The person skilled in the art will understand that various embodiments may be combined.

BRIEF DESCRIPTION OF THE DRAWINGS

These and other aspects of the invention will be apparent from and elucidated with reference to the embodiment(s) described hereinafter. In the following drawings.

DETAILED DESCRIPTION OF THE DRAWINGS

Figure 1:
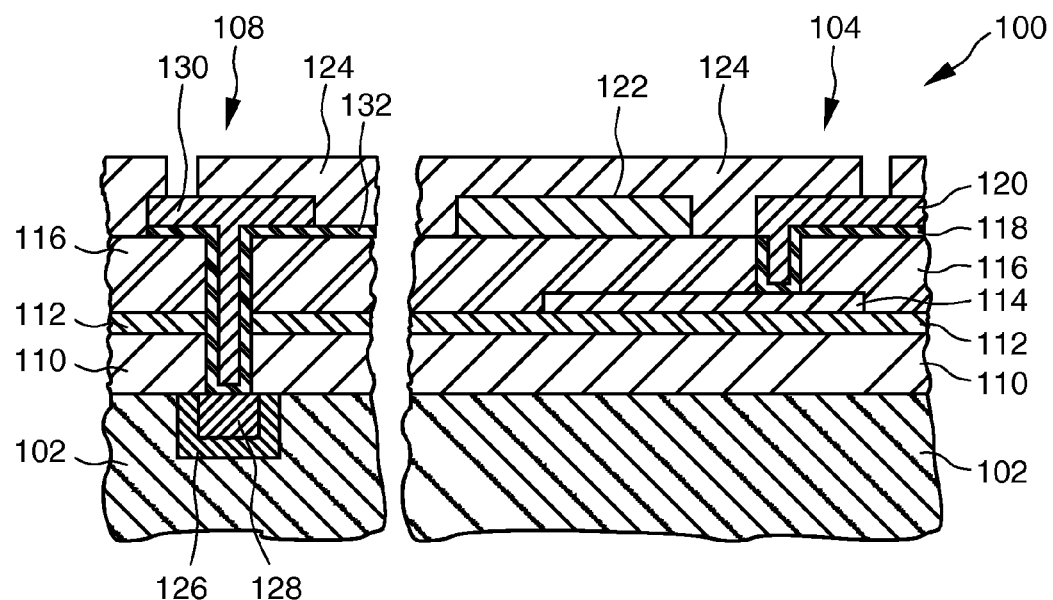
FIG. 1 is a schematic cross-sectional view of a section of an electronic component with a semiconductor substrate and an integrated circuit that comprises an electric component with at least one MIM capacitor.

FIG. 1 is a schematic cross-sectional view of a section of an electronic component with a semiconductor substrate and an integrated circuit that comprises an electric component with at least one MIM capacitor. The electronic component 100 has a semiconductor substrate 102. The semiconductor substrate 102 may for instance be a silicon substrate. However, other substrate materials, such as III-V semiconductor substrates or other group-IV substrates such as SiGe or SiC substrates may be used, depending on the desired application. The substrate may also be a layered structure, such as in a silicon-on-insulator substrate. Only the uppermost substrate section of the substrate 102 is shown in FIG. 1.

The embodiment of FIG. 1 comprises a capacitor 104, a resistor 106 and a diode 108. An insulating layer 110 is deposited on the substrate 102. The insulating layer may for instance be formed of $SiO_2$ or SiN. A barrier layer 112 is deposited on the insulating layer 110. The barrier layer 112 may for instance be made of SiN, $SiO_2$, $TiO_2$, $Al_2O_3$, $HfO_2$, MgO, $ZrO_2$, or a combination of these materials. On the barrier layer, a first capacitor electrode 114 of a first electrode material is formed. The first capacitor electrode is laterally structured and thus limited in its lateral extensions according to the needs of the specific capacitor design. The material of the first capacitor electrode 114 is metallic. In one embodiment, the first electrode comprises a Ti/Pt layer structure. For instance, a Ti layer with a thickness of 1-50 nm may by followed by Pt layer with a thickness of 20-600 nm. Alternatively, the first capacitor electrode 114 may be made of Pt only or Ti only. Furthermore, admixtures of W, Ru, Ir, N, Al, Ag, Rh, Cr, Si, alone or in combination, are suitable materials for the first capacitor electrode 114. The overall thickness of the first electrode may be chosen between 50 nm and 1 µm.

On top of the first capacitor electrode layer 114, a dielectric layer 116 is deposited. The dielectric layer 116 is made of a ferroelectric material having a dielectric constant of at least 100. The dielectric constant of a material is also known in the art as the relative permittivity. For the purpose of the present specification it is the relative-permittivity value at a given measurement frequency in the range between 0.1 kHz and 1000 kHz.

The material of the dielectric layer 116 may for instance be $PbZr_xTi_{1-x}O_3$ ($0 \leq x \leq 1$) with or without dopants such as La and/or Mn and/or Nb, and with or without excess Pb. The dielectric layer 116 may also be formed of a layered structure of different materials, differing for instance in the fraction of the different atoms in the above mentioned PZT or PLZT materials. Other ferroelectric materials are well known in the art and can be used for the dielectric layer 116 as well. Reference is for instance made to paragraphs [0030] to [0037] of US 2002/0177326 A1, wherein on page 3, left column, suitable dielectric materials for a "first dielectric layer 7" are mentioned. The ferroelectric materials mentioned there can also be used for the dielectric layer 116 of the present embodiment.

On top of the ferroelectric layer 116, a resistance layer 118 is provided, which together with a current supply lead 120 provides an electrical contact path to the bottom electrode 114. The resistance layer 14 may comprise, for example, β-Ta, tantalum nitride, polysilicon, $Ni_xCr_y$ ($0 \leq x$, $y \leq 1$), $Ti_xW_y$ ($0 \leq x$, $y \leq 1$), or other suitable resistance material known in the art.

In a lateral neighborhood of the current supply lead 118/120, a second or top electrode 122 is arranged on the dielectric layer 116. The top electrode layer 122 is suitably made of TiW. The material choice of the first and second electrode materials is such that the MIM capacitor 104 exhibits, as a function of a DC voltage applicable between the electrodes, an asymmetric capacitance hysteresis that lets the MIM capacitor, in absence of the DC voltage, assume one of at least two possible distinct capacitance values, in dependence on a polarity of a switching voltage last applied to the capacitor, the switching voltage having an amount larger than a threshold-voltage amount. The asymmetric capacitance hysteresis of the MIM capacitor 104 is described in more detail with reference to FIGS. 4 and 5. A suitable choice of the second or top electrode material is TiW, whereas a suitable choice of the bottom electrode is Ti/Pt. However, it should be noted that other material combinations are suitable as well. In particular, it is not an essential feature to use different materials. The inventors have observed that the capacitance hysteresis according to the present invention can also be achieved by processing normally identical materials in a different way during the fabrication process. For instance, the layers of the first electrode 114 and of the second electrode 122 may be deposited at different temperatures. At present, it seems that it is enough to achieve a difference in the work functions of the electrode materials of the first and second electrode to provide the desired asymmetric capacitance hysteresis according to the present invention.

The top electrode is covered by a protective layer 124, such as polyimide, $SiO_2$, SiN(H), or polybenzocyclobutene.

In the diode section 108 of the electric component 100, a diode is formed by adjacent p and n conductive layers 126, and 128, respectively. The diode is arranged in the silicon substrate 102 and contacted in very much the same way as the bottom electrode 114 of the ferroelectric MIM capacitor 104, namely, by a current lead 130, in combination with a resistive layer 132.

Figure 2:
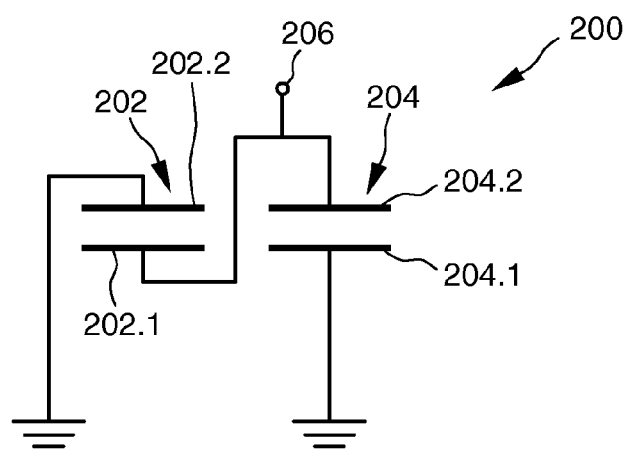
FIG. 2 shows a simplified circuit diagram of a second embodiment of an electric component.

FIG. 2 shows a simplified circuit diagram of a second embodiment of an electric component 200. The electronic component 200 has two MIM capacitors 202 and 204, for instance of the type shown on FIG. 1, which are in anti-parallel connection with each other. That is, both MIM capacitors 202 and 204 have a capacitance-voltage hysteresis of the same kind as described for the MIM capacitor 104 of FIG. 1. The anti-parallel connection of the capacitors is realized by connecting a bottom electrode 202.1 of the MIM capacitor 202 to a top electrode 204.2 of the second MIM capacitor 204. These two electrodes 202.1 and 204.2 are connected in parallel to a input terminal 206. Both remaining electrodes, i.e. a top electrode 202.2 of MIM capacitor 202 and bottom electrode 204.1 of MIM capacitor 204 are connected to a reference potential, which for instance is ground potential. A capacitance-sensor unit, which is not shown in FIG. 2 is configured to generate corresponding capacitance-sensor signals, which indicate the capacitance values in absence of a DC voltage of each of the MIM capacitors 202 and 204, respectively. Because a capacitance change will only be observed, if an applied bias voltage applied via the input terminal 206 has a given polarity, typically a negative polarity, the anti-parallel configuration of the two-MIM capacitors 202 and 204 ensures that always one of the two capacitors will experience the applied voltage as negative and therefore change its capacitance value. In this way, it is possible to simultaneously register the sign and the energy of an input voltage received via the signal input terminal 206, which could for instance an ESD pulse, or an otherwise applied bias voltage. As will be come apparent from the following description, it is possible to reset the capacitance of the MIM capacitor, which experienced a negative voltage, for instance after an ESD event. This way, the electric component 200 is able to register a next ESD event based on the same voltage dependent capacitance behavior.

Figure 3:
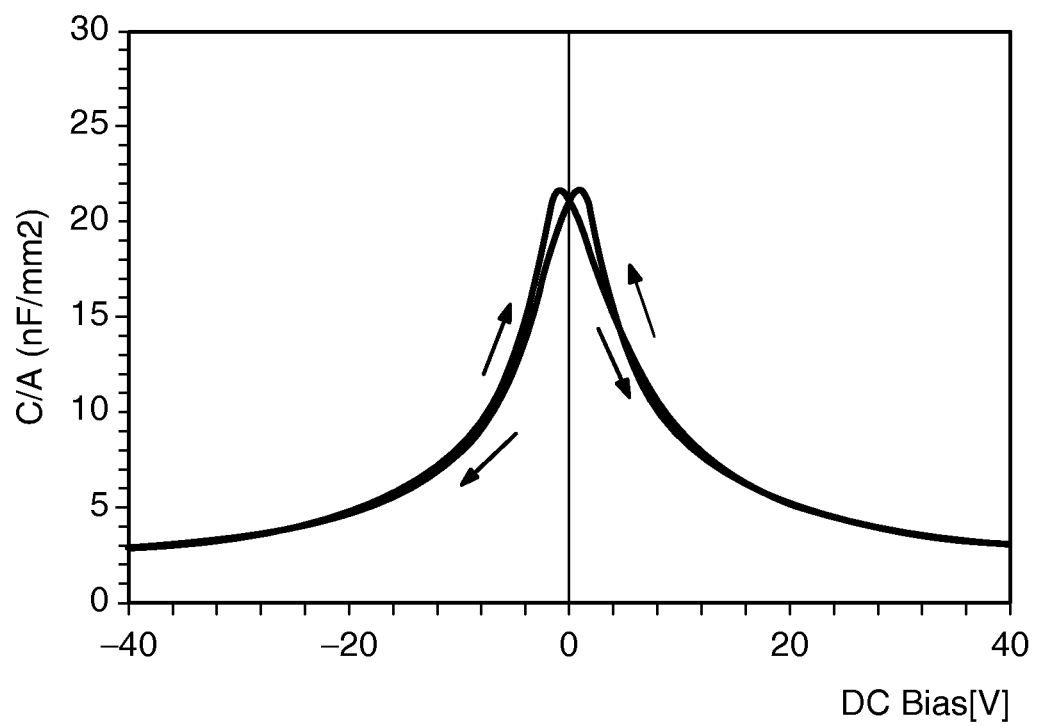
FIG. 3 is a diagram, which plots the ratio between a measured capacitance of a MIM capacitor with a prior-art design having symmetric electrode properties and a reference capacitance value as a function of a bias DC voltage applied between the capacitor electrodes.

FIG. 3 shows a diagram, which plots a measured capacitance density of a MIM capacitor with a prior-art design having equal electrode materials processed in an identical manner during fabrication as a function of a bias DC bias voltage applied between the capacitor electrodes. Small voltage pulses may be used in order to measure or probe the capacitance of a MIM capacitor. The voltage change that results on the capacitor itself must be lower than the coercive field to avoid switching of the capacitor.

The capacitance behavior is plotted for a voltage interval between −40 and +40 V. The capacitor used for this measurement has the following properties:
electrode material: Pt for both the top and bottom electrodes,
capacitor dielectric: PZT, i.e., lead zirconate titanate (Pb[$Zr_xTi_{1-x}$]$O_3$, $0<x<1$.

It should be noted that the specific dimensions of the capacitor do not much influence the capacitance-voltage hysteresis of the capacitor described in the following.

The general symmetric hysteresis curve of the type of FIG. 3 is called a "butterfly curve" in the art. It has two maxima: one for each sweep direction of the DC bias voltage. The sweep directions associated with the respective curves are indicated in FIG. 3 by arrows.

The curve representing the positive sweep direction (from negative to positive values) exhibits a resonance-like shape with a maximum at a DC voltage of approximately −3 Volt. At 0 V both curves, i.e., the one for the positive and the one for the negative sweep direction, cross each other at the same capacitance value. The capacitance difference is thus 0 nF/mm2 at or near a DC bias voltage of 0 V for the positive and negative sweep directions.

A difference between the capacitance values assumed in the two sweep directions becomes visible at a bias voltage of an amount larger than 0, such as the bias voltage values, at which the respective maxima occur. The measured capacitor shows only a very small hysteresis, i.e., has a small coercive field, which is desired for certain high-k applications. The hysteresis can be made stronger, while keeping the characteristic "butterfly" appearance with zero capacitance difference at 0 V, by choosing different electrode and ferroelectric materials. This is desired e.g., in FRAMs.

The hysteresis curve of this prior-art ferroelectric capacitor is symmetric in that the capacitance peaks for positive and negative sweep directions occur at the same voltage amounts and that at 0 V bias the difference in capacitance is 0 for typical capacitors.

In case of symmetric hysteresis curves, the polarity can be reversed without changing the capacitance at 0 V (the symmetry axis). The capacitance at 0 V is therefore also less sensitive to the voltage history than the capacitance next to the coercive voltage. The value at 0 V has been observed to differ by at most a few percent in other capacitors of the symmetric type as that used for FIG. 3. This capacitance difference is not significant enough to draw information on the voltage history of the capacitor in an electric component.

Figure 4:
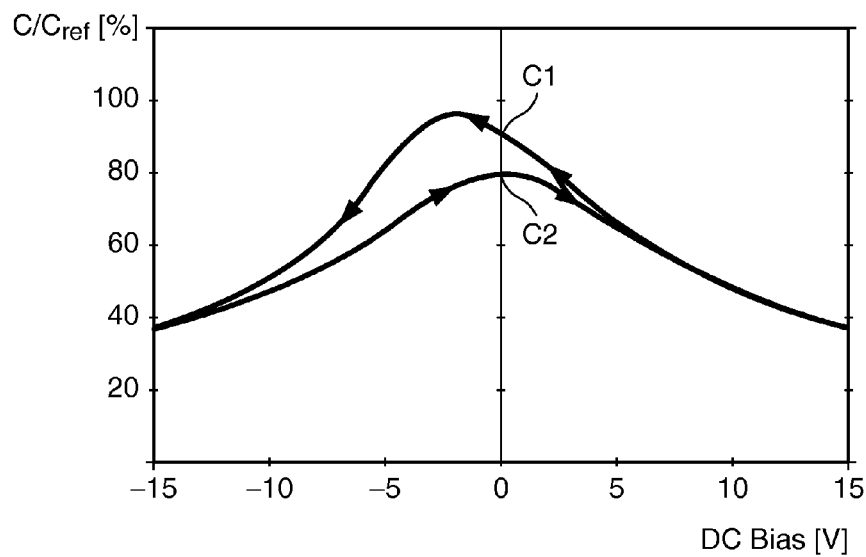
FIGS. 4 and 5 show capacitance-voltage hysteresis curves for a MIM capacitor of an electric component in accordance with the present invention.
Figure 5:
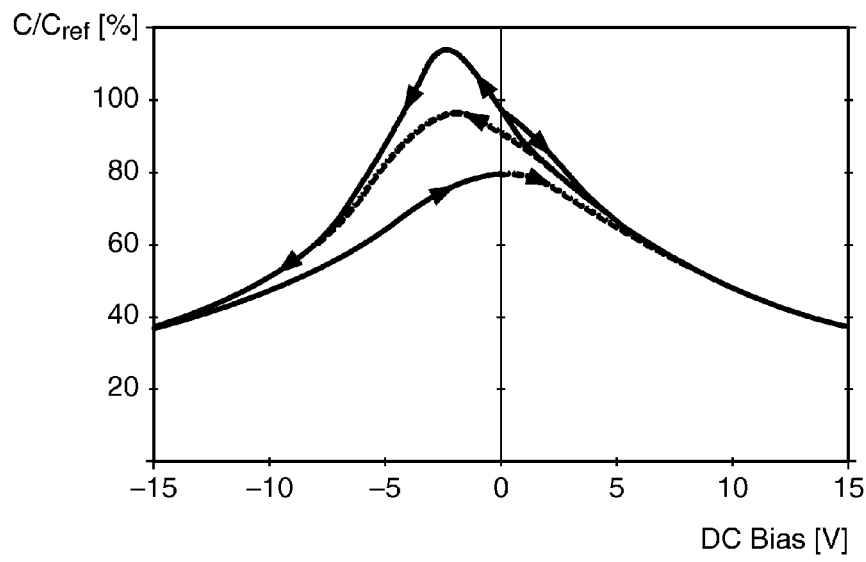

FIGS. 4 and 5 show capacitance-voltage hysteresis curves for a MIM capacitor of an electric component in accordance with the present invention. The same dielectric material was used as in the above case to clearly show the effect that is used within this invention.

A typical capacitor used for such measurements has the following parameters:
electrode material: Pt for the bottom electrode and WTi for the top electrode,
electrode area: 0.2 mm$^2$
capacitor dielectric: PZT
electrode distance: 360 nm The hysteresis curve of FIG. 4 is observable during operation with a bias voltage not exceeding +15 V or −15 V. The hysteresis curve of FIG. 5 shows the effects of an application of a 50 V pulse, as it can occur in ESD events, to the MIM capacitor on the hysteresis cycle. It should be noted that for the measurement of the hysteresis curves of FIGS. 4 and 5, one of the capacitor electrode, typically the bottom electrode of a MIM capacitor as shown in FIG. 1, was connected to ground as a reference potential.

First turning to the hysteresis curve of FIG. 4, a capacitor according to the present invention exhibits a capacitance-voltage hysteresis, which significantly differs from that of a prior-art capacitor shown in FIG. 3. The capacitance curve for a semi-cycle of the voltage change between −15 V and +15 V exhibits a capacitance increase from slightly below 40% at −15 V to only about 80% at 0 V and back down to slightly below 40% at +15 V. In contrast, decreasing the voltage again from +15 V to 0 V, the capacitance increases strongly to almost 100% and reaches its maximum at 100% at a negative voltage of about −3 V, and then decreases with further increasing amount of the negative voltage from 100% to slightly below 40% at −15 V, thus completing the hysteresis cycle. Not only are the respective maxima of the capacitance-voltage dependency found at different voltage values. For application purposes it is much more important that the capacitance values in absence of the bias voltage differ very strongly, depending on the voltage history of the capacitor. If an applied bias voltage was positive, the capacitance sensed in absence of the bias voltage is significantly higher than in the case of a previously applied negative bias voltage. The capacitance difference between the two cases is about 20%. Thus, the MIM capacitor of the electric component of the present invention allows detecting the polarity of a bias voltage last applied to the capacitor. To achieve this effect, the bias voltage must exceed a certain threshold voltage, so as to exceed the coercive field of the well-known hysteresis of the electrical polarization in dependence on an applied electric field of a ferroelectric capacitor.

FIG. 5 shows a hysteresis curve of a ferroelectric MIM capacitor of the present invention exhibits when subjected to a voltage pulse of suitable polarity and voltage amount. In the present example, the same capacitor as that used for measuring the hysteresis curve of FIG. 4 has been used for the measurement. Dashed curve sections correspond to the hysteresis behavior observable under the conditions explained in FIG. 4, i.e. a variation of the DC bias voltage between −15 V and +15 V. For the present measurement, however, the voltage was initially turned from 0 V (achieving a reference capacitance value of 100%) to plus +50 V (the voltage range between +15 and +50 V is not plotted in the diagram). When returning from the "flashing voltage" of +50 V to 0 V, the capacitance value returns to its original value of 100%, but further increases strongly to a value of 120% at the maximum position of about −3 V. This extra increase can be used to discriminate the strength of ESD events. It then decreases again with increasing amount of negative bias voltage, down to a capacitance value of slightly less than 40%, very much the same as for the "normal" hysteresis cycle observed for a voltage variation between −15 and +15 V. From then on, varying the applied DC bias voltage between −15 and +15 V will result in the same capacitance-voltage hysteresis that has been described with reference to FIG. 4 and is indicated in FIG. 5 by dashed curve sections.

The diagrams of FIGS. 4 and 5 show that the application of a negative voltage to the MIM capacitor of the present invention leads to a significant decrease in capacitance, as measured in absence of a DC bias voltage. The capacitance can be restored by application of a positive DC bias voltage. The capacitance change observed does not only depend on a suitable polarity of the DC bias voltage applied to the capacitor, but also on its amount. This way, it becomes possible to also determine the energy of a voltage pulse applied to the capacitors, using the capacitance change measured in absence of a bias voltage.

Figure 6:
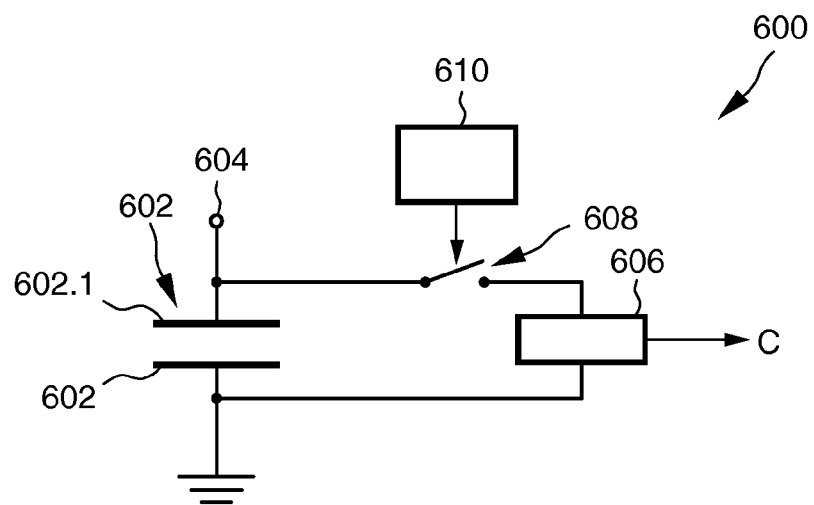
FIG. 6 shows a simplified circuit diagram of an electric component according to a further embodiment of the present invention, which can be used as an ESD sensor.

FIG. 6 shows a simplified circuit diagram of an electric component 600 according to a further embodiment of the present invention. The electric component 600 has a ferroelectric MIM capacitor 602 of the type described in connection with FIG. 1 and exhibiting a capacitance-voltage hysteresis of the type shown in FIGS. 4 and 5. A first electrode 602.1 of the capacitor 602 is connected to an input terminal 604. A second capacitor electrode 602.2 of the ferroelectric MIM capacitor 602 is connected to ground. The electric component further comprises a capacitance-sensor unit 606. The capacitance-sensor unit 606 is connected in parallel to the capacitor to the ferroelectric MIM capacitor 602 between the input terminal 604 and ground. A controllable switch 608 is switched between the input terminal 604 and the capacitance-sensor unit 606 and allows disconnecting the capacitance-sensor unit from the ferroelectric MIM capacitor 602. A control unit 610 is connected with the controllable switch 608 and serves to open or close the switch 608, depending on either self-generated control signals or on an external input (not shown).

In operation, the controllable switch 608 will be in its open position as long as the capacitance of the ferroelectric MIM capacitor 602 shall not be measured. If the capacitance shall be measured, the switch 608 is closed and a capacitance measurement is initiated. According to the present invention, the capacitance measurement is performed in absence of a DC bias voltage applied to the capacitor 602. This can also be approximated by using a very small bias voltage. A very small bias voltage used in a capacitance measurement should be very small in comparison with a coercive voltage that generates the coercive field of the ferroelectric layer inside the ferroelectric MIM capacitor 602. The determined capacitance value is provided at the output of the capacitance-sensor unit 606. Techniques for measuring the capacitance will be explained further below in more detail, including configurations that are suited to withstand large ESD pulses, e.g., a large resistor as replacement of the switch.

The electric component 600 can for instance be used as an ESD sensor. The occurrence of an ESD pulse can be detected even a long time after its occurrence by sensing the capacitance of the ferroelectric MIM capacitor 602. An improvement of the design of the electric component of FIG. 6 is achieved by using two ferroelectric capacitors in an anti-parallel configuration, as has been shown in connection with FIG. 2. An anti-series configuration is also possible and has similar advantages, but is not shown here.

Two use cases illustrate the advantage achieved with the ESD sensor of the present embodiment:
a) the occurrence of ESD events in an integrated circuit can be detected in off-line measurements, e.g., in products returned to a seller or service provider, in order to check for over-voltage. The probing can be performed using probe-pads.
b) the occurrence of ESD events in an integrated circuit or chip can additionally or alternatively be detected "in situ", in the field.:in this case, the chip for instance probes an RC-network. Internal switches can be used if disconnecting the capacitor from the network is desired. Such switches also must be protected against ESD. In both cases, an anti-series configuration might be useful.

Figure 7:
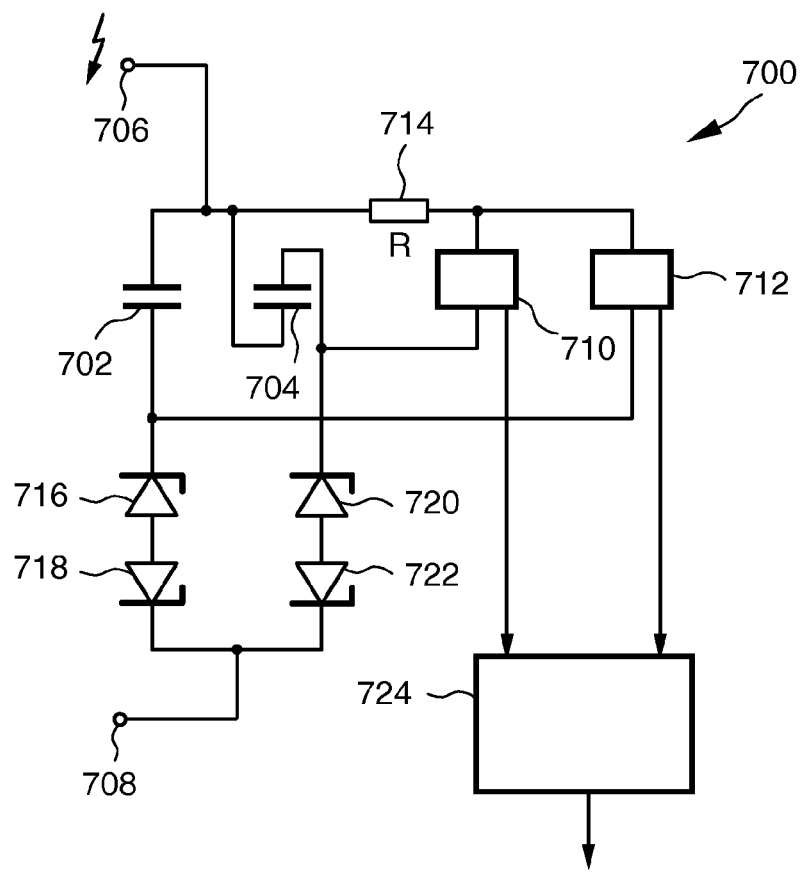
FIGS. 7 to 10 are simplified circuit diagrams of different embodiments of electric components implementing at least two ferroelectric MIM capacitors.

FIG. 7 is a simplified circuit diagram of an electric component 700 implementing the principle of two ferroelectric MIM capacitors 702 and 704, which are connected in an anti-parallel configuration. Both capacitors are connected to input terminal 706 and 708, and both ferroelectric capacitors 702 and 704 are connected to a respective capacitance-sensor unit 710 and 712, respectively. A resistor 714 serves to protect the capacitance-sensor units 710 and 712 against high voltages occurring in an ESD event. A respective pair of Zener-diodes 716, 718 and 720, 722 is connected between the input terminal 708 and the respective MIM capacitor 702 and 704. Each pair has the Zener diodes connected with each other in an anti-serial (back-to-back) manner. This way, the voltage applied to the capacitors in an ESD event can be limited to a maximum amount, the Zener voltage of the diodes.

The outputs of the capacitance-sensor units 710 and 712 are fed to a comparator 724, which is configured to compare the capacitance values determined for the first and second ferroelectric MIM capacitors 702 and 704. In an alternative embodiment, the comparator is extended by an evaluation unit (not shown), which is configured to derive information on an energy amount and polarity applied at the input terminals 706 and 708 from the measured capacitance values of the ferroelectric MIM capacitors 702 and 704. As previously mentioned, the use of two anti-parallel ferroelectric MIM capacitors allows determining the polarity of the input voltage applied to the input terminals 706 and 708, always assuming that the input voltage exceeds a threshold amount. A capacitance change at 0 V is only detectable in case the threshold-voltage amount has been exceeded with a suitable polarity. The corresponding voltage, which herein is also referred to as the switching voltage, depends on the particular design of the ferroelectric MIM capacitor used, in particular on its geometrical parameters such electrode extension and ferroelectric-layer thickness, but also on the dielectric constant of the ferroelectric layer.

A reset-voltage can be applied from the measurement units 710 and 712 to the capacitors 702 and 704 for re-initializing the electric component 700 for further operation. The reset unit (not shown) is configured to generate and provide at its output a reset voltage of a suitable polarity, which is a positive polarity for the capacitor 702 and a negative polarity for the capacitor 704 or vice versa. This way, the original capacitance of this capacitor can be restored. The capacitance of the other capacitor, which was not switched by the application of a switching voltage to the input terminal 706, remains unaffected by the application of the reset voltage with this polarity. The electric component 700 can thus for instance be used as a resettable ESD sensor.

Figure 8:
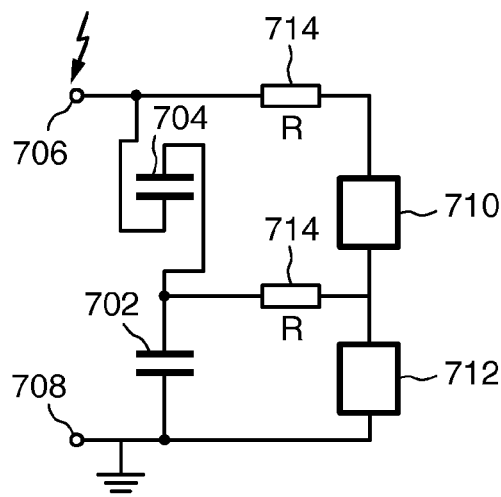

FIG. 8 shows an alternative configuration 700'. Identical reference labels as in FIG. 7 for corresponding circuit elements are used in the FIG. and in the following description. The circuit 700' differs from the circuit 700 in that the MIM capacitors 702 and 704 are provided in an anti-serial connection with each other. Since the capacitor electrodes have different properties in the MIM capacitors of the present invention, a serial connection of the capacitors 702 and 704 has different properties than an anti-serial connection, which in turn also allows detecting the polarity of an ESD event using a comparison of the capacitances of the MIM capacitors 702 and 704. The capacitance-sensor units 710 and 712 are also provided in a series connection with each other, and in parallel to the respective MIM capacitor to be measured, each protected by a respective resistor 714.

Figure 9:
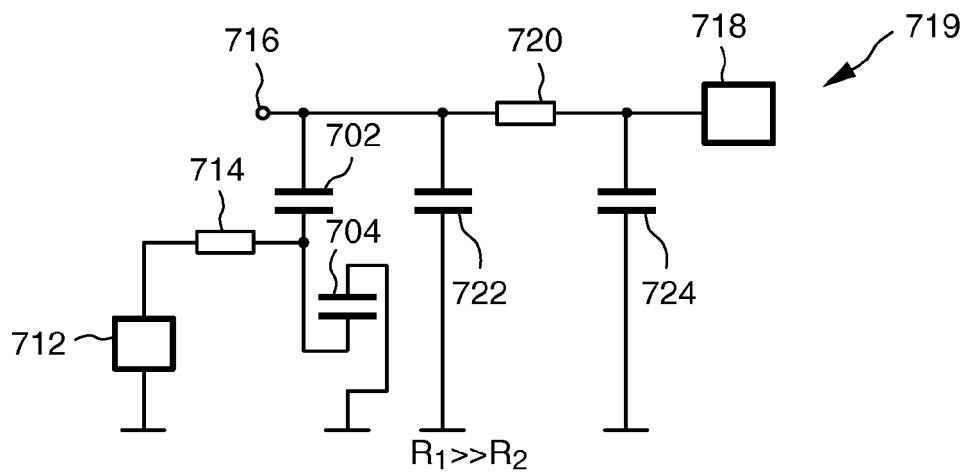

FIG. 9 shows a further embodiment of an electric component for illustrating how the antiserial connection implemented by the ESD sensor 700' of FIG. 8 can be included in an RC-network 719 having a resistor 720 and two capacitors 722 and 724 and that forms a low-pass filter. The ESD sensor is connected to an input 716. The measurement unit 710 of the ESD sensor 700' can be omitted if a device 718 at the output side provides a bias voltage of 0V. A measurement resistor R1 should preferably be larger than a network resistor 720 to not influence the RC network 719 strongly. The same holds for the capacitance value of the ESD-detection capacitors 702 and 704.

Figure 10:
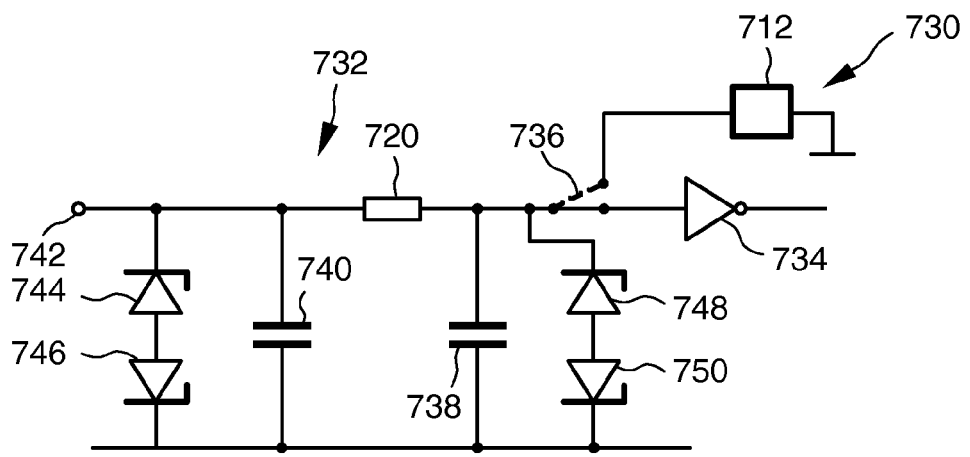

As an alternative, the detection capacitors and the measurement resistor can be included in the network design by adapting the network capacitors and resistors so that the an influence of the measurement unit is compensated. As a further illustrative example, FIG. 10 shows an embodiment of an electronic component forming a circuit network 730, in which an ESD sensor is integrated. The measurement unit 712 is integrated together with an input amplifier 734 and a switch 736 into a single chip. ESD protection diodes 7. This configuration does not require any extra chip connectors or separate chips.

The measurement unit 712 serves to measure the capacitance of a RC network 732 and hence, dependent on the measurement frequency (or ramp rate), the capacitance of the "nearest" capacitor 738 or the sum of both capacitors 738 and 740. If both are measured, and the capacitors 738 and 740 are hysteretic and are configured in anti-parallel, then an ESD pulse polarity can be measured if it can charge the second capacitor 740 fast enough. In any case, a change of the capacitor connected to the input can be measured, so that at least a single polarity ESD pulse can be detected.

The operating principle is as follows: in normal operation the switch 734 is connected to the application device, i.e., the input amplifier 734 in this case. The capacitors 738 and 740 can be measured by switching from the application device 734 to the measurement unit 712. Thus ESD events can be measured, e.g., every time an apparatus incorporating the circuit network 730 is switched on or off, or any time it is desired to know whether an ESD event has occurred. In a variant of the present embodiment, the information ascertained on the occurrence of an ESD event can be stored in a non-volatile memory (not shown). This information could be used to improve products.

With electric components of FIGS. 6 to 10, ESD sensors can be fabricated and integrated into other circuits. This allows to test the integrity of the connected circuitry in the field. For instance, if the ESD sensor of FIG. 7 determines that an ESD event has occurred and applied a voltage pulse exceeding a certain energy to the circuitry, a high probability of damage to the circuitry may be reported to a control instance, for instance by an embedded wireless or wired module. However, if the energy amount delivered by the ESD pulse was lower than a certain threshold, operation of the circuitry may be continued, and the ESD sensor can be reset for being ready to detect a next ESD event.

Figure 11:
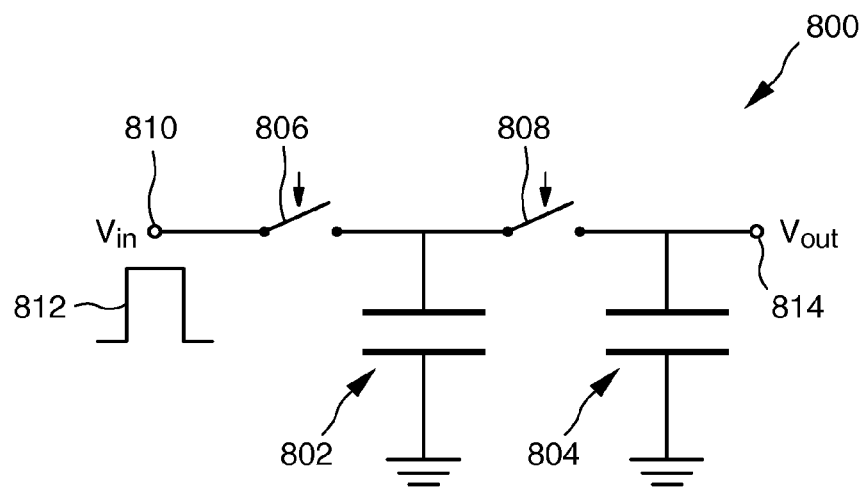
FIG. 11 is a simplified circuit diagram for illustrating an embodiment of an electric component of the present invention, which can be used as a capacitance detection circuit, a ferroelectric memory, or an ESD sensor.

FIG. 11 is a simplified circuit diagram for illustrating an embodiment of an electric component of the present invention, which can be used as a capacitance detection circuit, a ferroelectric memory, or an ESD sensor. The electric component 800 of FIG. 8 has two capacitors 802 and 804 connected in parallel. The capacitor 802 forms a reference capacitor. The capacitor 804 is a switchable ferroelectric capacitor according to the present invention. Controllable switches 806 and 808 are connected between an input terminal 810 and the reference capacitor 802 and between the reference capacitor 802 and the switchable ferroelectric MIM capacitor 804, respectively. The switchable MIM capacitor 804 can be switched by applying a voltage pulse 812 via the input terminal 810, by first opening switch 808 and closing switch 806, thus charging the reference capacitor 802. Subsequently, the charge is transferred to the switchable MIM capacitor 804 by opening the switch 806 and closing the switch 808. The read-out voltage at an output terminal 814 will depend on the capacitance of the switchable MIM capacitor 804. In case the capacitance is high, a high voltage will be detected. In case the capacitance is low, a lower voltage will be detected. For readout, a small probe capacitor (e.g. on a read-out chip) is discharged into the MIM capacitor and generates a small voltage increase. This increase is smaller if the capacitance is larger.

Figure 12:
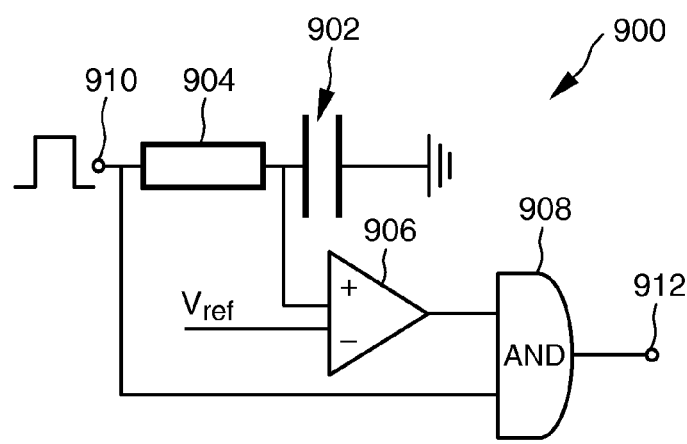
FIG. 12 is a simplified circuit diagram of an example of a read-out circuit for use with a ferroelectric MIM capacitor in a ferroelectric memory.

FIG. 12 is a simplified circuit diagram of an example of a read-out circuit for use with a ferroelectric MIM capacitor in a ferroelectric memory. This example of an electric component 900 has a ferroelectric MIM capacitor 902 according to the present invention, connected in series with a resistor 904, a comparator 906 has a first input connected between the ferroelectric MIM capacitor 902 and the resistor 904 and a second input connected to a reference voltage, which is smaller than the switching voltage of the ferroelectric capacitor. The output of the comparator 906 is connected to an AND gate 908. A second input of the AND gate 908 is connected to an input terminal 910.

For reading out the capacitance value of the ferroelectric MIM capacitor 902, a probe pulse is applied at the input terminal 910. The capacitor 902 is charged to a small amount. Depending on the capacitance value of the ferroelectric MIM capacitor 902, the comparator will detect a voltage at the capacitor which is higher or lower than the reference voltage. The output of the comparator determines the output of the AND gate 908 at the time of the application of the bias pulse for sensing the capacitance of the ferroelectric MIM capacitor 902.

Figure 13:
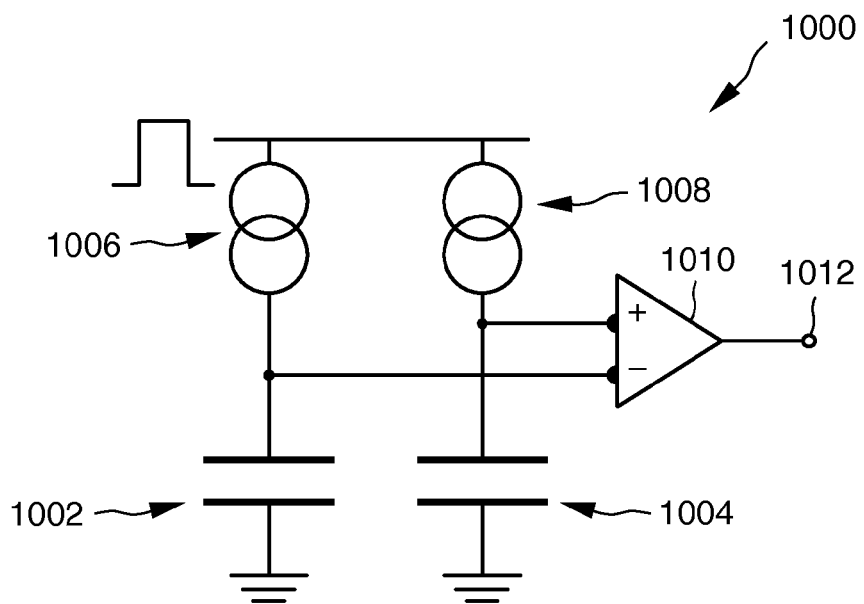
FIG. 13 is a further alternative embodiment illustrating a circuit section for reading out a ferroelectric memory using a ferroelectric MIM capacitor according to the present invention.

FIG. 13 is a further alternative embodiment illustrating a possibility for reading out a ferroelectric memory using a ferroelectric MIM capacitor according to the present invention. This ferroelectric memory 1000 comprises two ferroelectric MIM capacitors 1002 and 1004 according to the present invention. Each of the capacitors 1002 and 1004 has one electrode connected to a current source 1006 and 1008, respectively, and its other electrode connected to ground potential. Connected between the respective current source and the capacitor electrodes is a comparator. The current source should be dimensioned such that the voltage increase at the capacitor stays well below the switching voltage. A first estimate would be: $I<0.25*Cmin(0V)*Vc/tm$, where Vc denotes the switching voltage (coercive voltage) and tm the duration of the current of amplitude I. The current sources can also be replaced by resistors.

The switching (writing) circuitry is not shown in the present circuit. In particular, set and reset switches are not shown in this simplified circuit diagram. However, the capacitors can be set and reset in an entire parallel manner with a bias pulse and a respective current-source setting. The combinations of low capacitance and high capacitance and vice versa are sensed by a comparator 1010 and a corresponding output bit is provided at an output 1012 of the comparator 1010.

Figure 14:
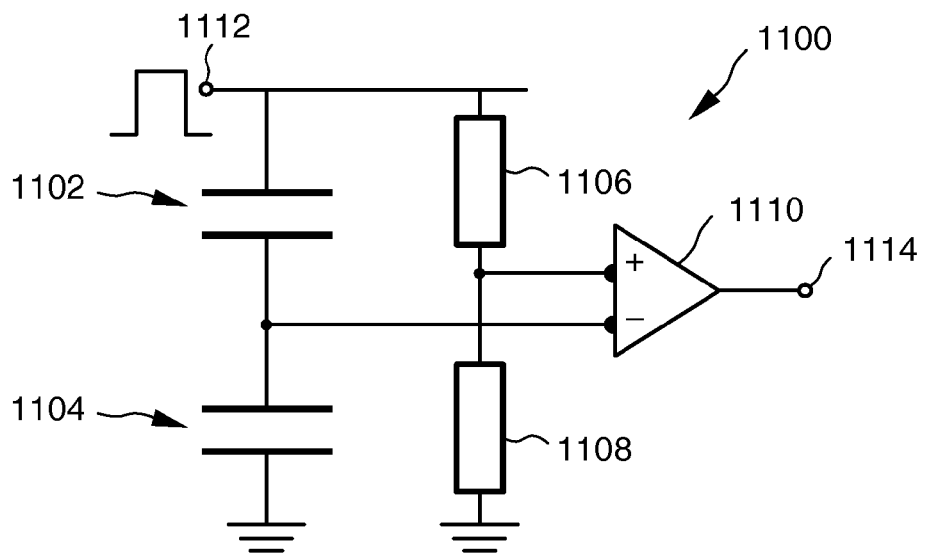
FIG. 14 provides a further alternative embodiment of a read out circuitry for a ferroelectric memory using two ferroelectric MIM capacitors according to the present invention.

FIG. 14 provides a further alternative embodiment of a read out circuitry for a ferroelectric memory using two ferroelectric MIM capacitors according to the present invention. The ferroelectric memory 1100 comprises two ferroelectric MIM capacitors 1102 and 1104 connected in series between a bias potential and a reference potential, such as ground potential. A series connection of two resistors 1106 and 1108 is connected in parallel to the capacitors 1102 and 1104. A comparator 1110 has one input connected between the two capacitors 1102 and 1104 and its other input connected between the two resistors 1106 and 1108. Again, as in FIG. 10, the switching circuitry is not shown here. However, the switching circuitry is connected with the two capacitors in an entire parallel manner such that only one capacitor is switched upon application of a switching voltage. This way, a respective combination of a high capacitance and a low capacitance can be defined in dependence on the polarity of the switching voltage. By applying a small bias voltage, the capacitance combination is sensed by the comparator and provided at its output 1114 and bias voltage via an input terminal 1112.

Figure 15:
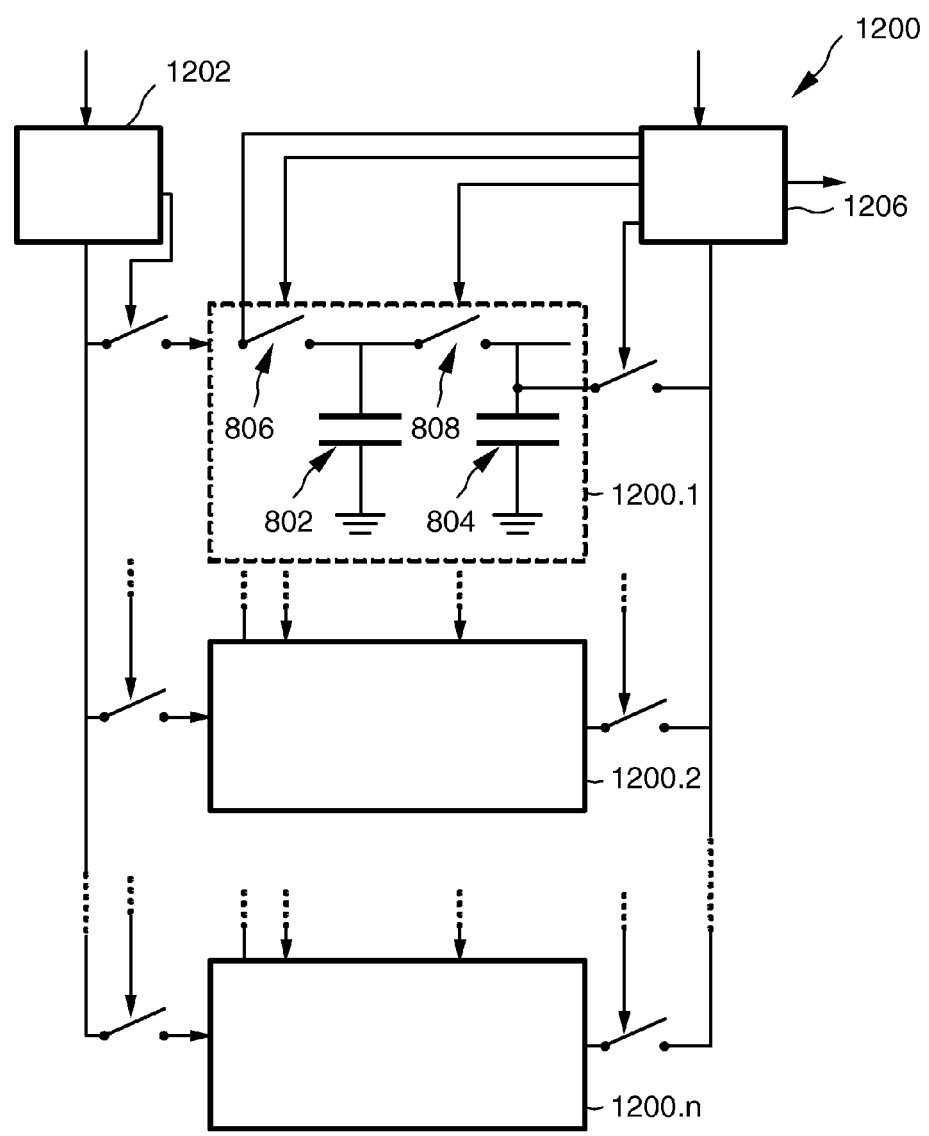
FIGS. 15 and 16 are schematic and simplified circuit diagrams of ferroelectric memory devices according to further embodiments of an electric component of the present invention.

FIG. 15 is a schematic and simplified circuit diagram of a ferroelectric memory device according to a further embodiment of an electric component of the present invention. The memory device 1200 comprises a number of memory cells 1200.1, 1200.2 through 1200.n, which in the present embodiment are arranged in a parallel connection, implementing for instance a single row or a single column of a matrix arrangement of memory cells (not shown). The detailed structure of a memory cell can be chosen to any of the previously described embodiments, see FIGS. 8 through 11. For illustration purposes, the present embodiment uses the structure of FIG. 8. Details are only shown for the memory cell 1200.1. It is assumed that all further memory cell 1200.2 through 1200.n have the same internal structure, which is not shown for reasons of graphical simplicity.

A write controller 1202 is connected which each of the memory cells 1200.1 through 1200.n and is configured to selectively switch the capacitance of the ferroelectric MIM capacitor of a respective memory cell, such as for instance the ferroelectric MIM capacitor 1204 of the memory cell 1200.1. The write controller 1202 further has an input for receiving address information allowing to identify, which of the memory cells is to be written to, and for receiving write data, which is the data to be stored in a respective memory cell to be written to. On the output side of the ferroelectric memory 1200, a read controller 1206 is connected with each of the memory cells 1201 through 1200.n. The read controller 1206 is configured to provide the control signals required for switching the switches 806 and 808 during a readout of the memory cell. Furthermore, the read controller 1206 has a control output for selecting a respective memory cell to be read. Memory cells can be selected according to address information received by the read controller 1206 with a read request. The received information is retrieved by the write controller and provided at its output.

Figure 16:
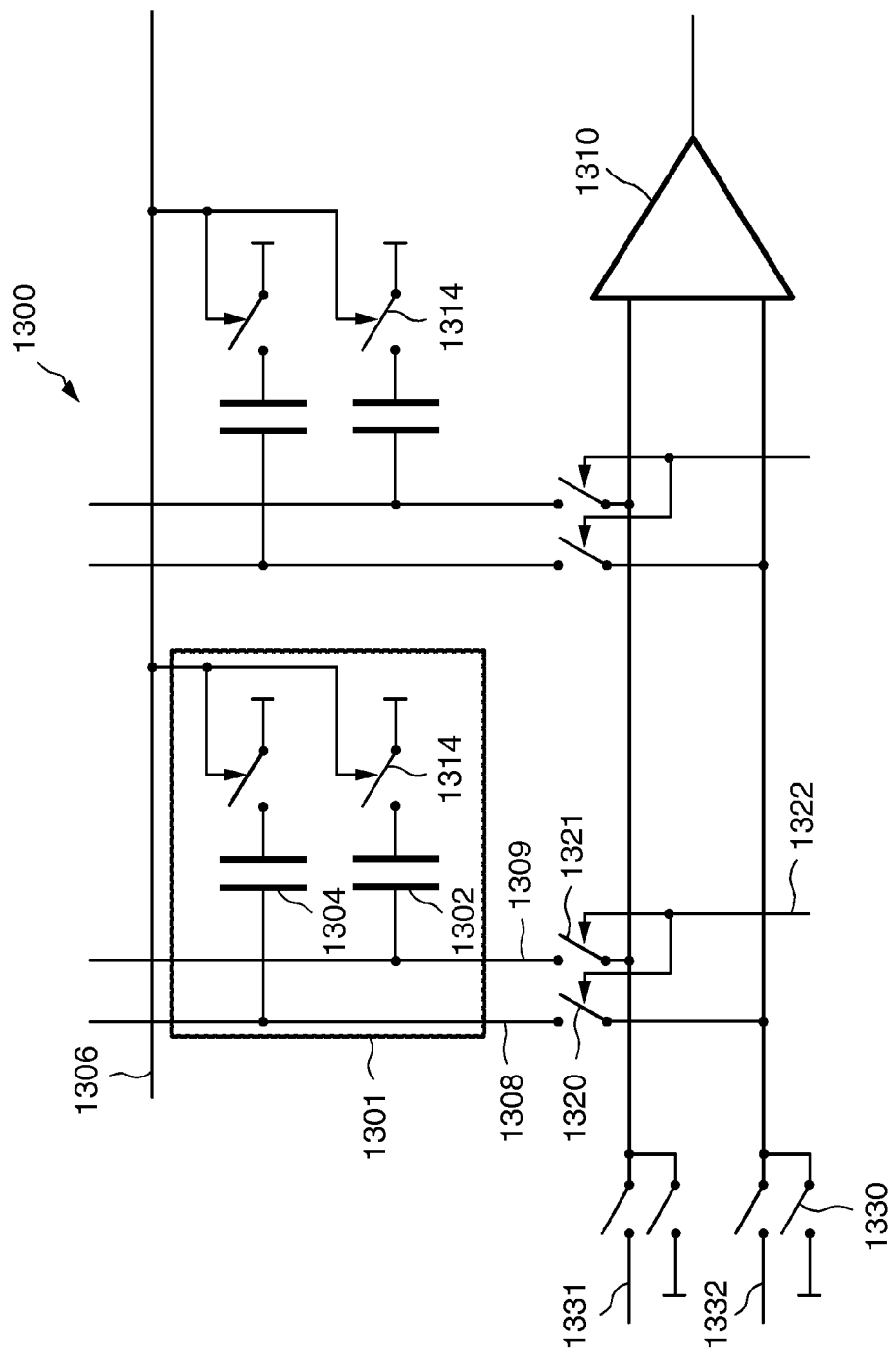

Other, even more economic configurations as memory may be employed, which is illustrated in FIG. 16. For graphical simplicity, FIG. 16 only shows two memory cells in one row. The configuration is similar to that of FIG. 13. A first cell 1301 has two ferroelectric MIM capacitors 1302 and 1304. The capacitors, instead being connected directly to a (virtual) ground potential as in FIG. 13, are connectable with their bottom electrodes to a (virtual ground) by the switches 1312 and 1314, and the top electrodes to two column lines 1308 and 1309. The switches 1312 and 1314 are controlled by the row select line 1306. The columns 1308 and 1309 are selected by switches 1320 and 1321, which are controlled by the column select line 1322. Readout is possible by providing a probe current via the connections 1331 and 1332 as described in FIG. 10 with the current sources 1006 and 1008 and a detection unit 1310. A switching voltage of desired polarity, positive or negative, is also applicable to the ferroelectric MIM capacitors 1302 and 1304 of a selected cell 1301 via the switches 1330. The probe current sources could provide the switching voltage of desired polarity, or a separate voltage source can be attached. The switches 1330 can also be used to discharge the capacitors before readout or after writing.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

Any reference signs in the claims should not be construed as limiting the scope.

The invention claimed is:
1. An electric component comprising:
  at least one first MIM capacitor having a ferroelectric insulator layer with a relative permittivity of at least 100 between a first capacitor electrode of a first electrode material and a second capacitor electrode of a second electrode material; wherein the first and second electrode materials are selected such that the first MIM capacitor exhibits, as a function of a DC voltage applicable between the first and second electrodes, an asymmetric capacitance hysteresis that lets the first MIM capacitor, in absence of the DC voltage, assume one of at least two possible distinct capacitance values, in dependence on a polarity of a switching voltage last applied to the capacitor, the switching voltage having an amount larger than a threshold-voltage amount:

a circuit, which is operably connectable to the MIM capacitor and which configured to generate and provide an output signal, which depends on the capacitance value of the at least one first MIM capacitor either assumed in absence of the DC voltage on the first MIM capacitor or at an amount of the DC voltage on the first MIM capacitor, which is smaller than a quarter of a voltage difference between a positive and a negative coercive voltage associated with the ferroelectric insulator layer of the first MIM capacitor:

a second MIM capacitor of the same type as the first MIM capacitor, wherein the first capacitor electrode of the first MIM capacitor and the second capacitor electrode of the second MIM capacitor are both connected to a reference potential;

the switching voltage is applicable in parallel to the second electrode of the first MIM capacitor and to the first capacitor electrode of the second MIM capacitor; and wherein the capacitance-sensor unit is configured to generate first and second capacitance sensor signals indicative of the capacitance values in the absence of the DC voltage of the first and of the second MIM capacitors, respectively.

2. The electric component of claim 1, wherein the first and second electrode materials are metallic and differ from each other at least by having different work functions.

3. The electric component of claim 1, wherein the capacitance-sensor unit is additionally configured to compare the capacitance values for the first and second MIM capacitors, and to provide a polarity information indicative of the a polarity of the switching voltage last applied to the MIM capacitor, in dependence on the result of the comparison.

4. An RF component comprising an electric component of claim 1, wherein the circuit of the electric component is configured to generate an output signal with a frequency that depends on the capacitance of the MIM capacitor in the absence of the DC voltage on the first MIM capacitor or at an amount of the DC voltage on the first MIM capacitor, which is smaller than a quarter of a voltage difference between a positive and a negative coercive voltage associated with the ferroelectric insulator layer of the first MIM capacitor, or wherein a response of the RF component to RF signals depends on the capacitance of the MIM capacitor in the absence of the DC voltage on the first MIM capacitor or at an amount of the DC voltage on the first MIM capacitor, which is smaller than a quarter of a voltage difference between a positive and a negative coercive voltage associated with the ferroelectric insulator layer of the first MIM capacitor.

5. An electronic component, which comprises a semiconductor substrate with an integrated circuit having an electric component according claim 1 and one or more of the following components integrated in or on the substrate:
a resistor
a ferroelectric capacitor
an ESD protection diode;
an ESD sensor according to claim 6; or
an active integrated circuit.

6. An ESD sensor for detecting the occurrence of an electrostatic discharge event in an electronic circuit, comprising an electric component according to claim 1.

7. The ESD sensor of claim 6, further comprising an ESD evaluation unit, which is connected with the capacitance-sensor unit of the electric component and configured to derive from the capacitance-sensor signals information on an energy amount and polarity provided to the ESD sensor by the electrostatic discharge event.

8. The ESD sensor of claim 6, further comprising a reset unit, which is connected with the capacitance sensor unit and which is configured, after a detection of the capacitance of the first MIM capacitor or the second MIM capacitor having assumed the respective lower capacitance value, to provide a reset voltage of a reset-voltage amount and a reset-voltage polarity to the first and/or second capacitor, respectively, such that the first and second MIM capacitors both re-assume their respective higher capacitance value.

9. A method for detecting an occurrence of an electrostatic discharge event in an electronic component, comprising:
providing the electronic component, with an ESD sensor according to claim 6,
ascertaining the capacitance of the at least one first MIM capacitor, in the absence of a DC voltage applied to the electrodes of the at least one first MIM capacitor.

10. A ferroelectric memory, comprising an electric component according to claim 1.

11. The ferroelectric memory of claim 10, further comprising:
a plurality of first MIM capacitors, each associated with an address and each being configured to store at least one respective bit of information in the form of a respective capacitance value assumed in absence of a DC voltage applied between the capacitor electrodes,
a read unit, which comprises the capacitance-sensor unit and has an input for receiving address information indicative of at least one of the first MIM capacitors to be read; and
a write unit, which comprises the switching unit, and which has an input for receiving write information to be written to the memory, and address information indicative of at least one of the first MIM capacitors to be written to.

12. A method for reading from a ferroelectric memory, comprising:
providing a ferroelectric memory according to claim 10;
receiving address information of at least one memory cell to be read from;
ascertaining the capacitance of the at least one first MIM capacitor of the at least one memory cell indicated by the address information, in the absence of a DC voltage applied to the electrodes of the at least one first MIM capacitor.

* * * * *